US006756596B2

(12) United States Patent
Sathrum (10) Patent No.: US 6,756,596 B2
(45) Date of Patent: Jun. 29, 2004

(54) FILTERED ION SOURCE

(76) Inventor: Paul E. Sathrum, 742 Kanaka Bay, Friday Harbor, WA (US) 98250

( * ) Notice: Subject to any disclaimer, the term of this patent is extended or adjusted under 35 U.S.C. 154(b) by 2 days.

(21) Appl. No.: 10/121,443

(22) Filed: Apr. 10, 2002

(65) Prior Publication Data

US 2003/0193031 A1 Oct. 16, 2003

(51) Int. Cl.[7] .................................................. H01J 27/14
(52) U.S. Cl. ...................................................... 250/426
(58) Field of Search ............................ 250/423 R, 424, 250/426; 204/192.38

(56) References Cited

U.S. PATENT DOCUMENTS

| | | | |
|---|---|---|---|
| 4,452,686 A | | 6/1984 | Axenov et al. |
| 4,845,041 A | * | 7/1989 | Scuitto et al. ............... 436/172 |
| 4,929,321 A | | 5/1990 | Buhl |
| 5,279,723 A | * | 1/1994 | Falabella et al. ....... 204/192.38 |
| 5,282,944 A | * | 2/1994 | Sanders et al. ......... 204/192.38 |
| 5,458,754 A | | 10/1995 | Sathrum et al. |
| 5,840,163 A | * | 11/1998 | Welty ..................... 204/192.38 |

OTHER PUBLICATIONS

Anders. S., et al., "S–Shaped Magnetic Macroparticle Filter for Cathodic Arc Deposition," *IEEE Transactions on Plasma Science* 25(4):670–674, Aug. 1997.

Kwok, D. T.–K., et al., "Ion Mean Charge State in a Biased Vacuum Arc Plasma Duct," *IEEE Transactions on Plasma Science* 28(6):2194–2201, Dec. 2000.

Martin, P.J., and A. Bendavid. "Ionized Plasma Vapor Deposition and Filtered Arc Deposition; Processes, Properties and Applications." *Journal of Vacuum Science & Technology A* 17(4):2351–2359, Jul./Aug. 1999.

Sanders. D.M., et al., "Coating Technology Based on the Vacuum Arc—A Review," *IEEE Transactions on Plasma Science* 18(6):883–894, Dec. 1990.

* cited by examiner

*Primary Examiner*—Nikita Wells
*Assistant Examiner*—Christopher M. Kalivoda
(74) *Attorney, Agent, or Firm*—Christensen O'Connor Johnson Kindness PLLC (57) ABSTRACT

The present invention relates to implementation of magnetic and electrostatic forces to guide ions along curved trajectories in an ion source such that macroparticles are separated from the ion stream. Magnetic and electrostatic fields act in concert with the present invention to cause ions to flow along curved trajectories from the arc source to an area where workpieces may be treated. Since macroparticles produced by consumable electrode sources are much less affected by magnetic and electrostatic fields, said macroparticles are able to be separated from the ion stream due to the curved trajectories followed by the ions. The present invention permits effective macroparticle filtering by incorporating a consumable electrode material that faces away from the workpieces and to a closed end of the ion source. This filtering technique allows separation of macroparticles from the ion stream without substantially compromising deposition area, deposition rate, ion transport efficiency and/or uniformity in coating.

26 Claims, 7 Drawing Sheets

FILTERED ION SOURCE

FIELD OF THE INVENTION

This invention relates generally to an ion source, and more specifically to a filtered ion source for use in a variety of ion applications where efficient ion transport and macroparticle filtering is desired.

BACKGROUND OF THE INVENTION

Ion sources are used in a variety of applications, from heat treatments to physical vapor deposition ("PVD") of materials on substrates. Typically, the ion source material is consumed and this results in the transmission of undesirable chunks or droplets called macroparticles. Macroparticles are undesirable for nearly all ion source applications, especially those applications involving PVD.

Prior art PVD techniques using an ion source incorporate a deposition or coating chamber in which a "plasma" of the coating material is produced and projected toward a substrate to be coated. Coatings applied to substrates and the shapes and materials of the substrates can vary widely, from decorative coatings on ceramic or pottery materials to circuit interconnection wiring paths on the surfaces of semiconductor chips, to wear-resistant coatings on cutting tools and bearing surfaces. Similarly, the physical nature and properties of the coating materials may vary widely, from conductive coatings to semiconductive coatings to those forming electrical insulators. Physical vapor deposition processes generally require evacuation of the deposition chamber prior to and maintenance of a negative pressure level during the deposition coating process. In an electric arc type ion source, after evacuation of the chamber, the typically solid sacrificial source material is acted upon by an electric arc that converts the solid source material into a vaporous plasma of coating material. Once converted into a plasma, a coating source material may be combined with reactive gasses or other elements within the chamber to form coating compounds and molecules prior to or during deposition thereof on substrate(s). The coating plasma typically includes atoms, molecules, ionized atoms and molecules, and agglomerates of molecules.

Frequently, PVD techniques using an electric arc are preferable over other deposition methods due to the production of copious numbers of ions. The production of a highly ionized plasma combined with the use of an electrically biased substrate, allows the arrival energy of the ions to be controlled during deposition, thereby providing for optimization of film properties such as stoichiometry, adhesion, density, and hardness. As an example, the hardness of hard carbon films deposited using cathodic arc evaporation have been shown to be approximately four times the hardness of magnetron-sputtered hard-carbon films, approaching the hardness of natural diamond. During operation, an arc-initiating trigger element is positioned proximate the cathode source and is positively biased with respect to the cathode. The trigger element is momentarily allowed to engage the surface of the cathode material, establishing a current flow path through the trigger and cathode. As the trigger element is removed from engagement with the cathode surface, an electric arc is struck and thereafter maintained between the cathode and the anode electrodes. The electric arc carries high electric current levels, typically ranging from 30 to several hundred amperes, and provides energy for vaporizing the coating source material.

Notwithstanding the noted benefits of PVD using a cathodic arc (hardness, density, adhesion, and stoichiometry), this deposition technique has been plagued with several problems such as the dislodging of undesirably large pieces of the coating material previously referred to herein as macroparticles. These chunks or droplets of source material lead to blemishes in the coatings and exclude unfiltered or poorly filtered cathodic-arc ion sources from use in applications requiring extremely smooth films such as optical coatings or computer hard dive protective overcoatings. A number of approaches have been advanced for the removal of macroparticles. Despite prior art efforts at eliminating the transmission of macroparticles, no macroparticle removal techniques of the prior art (commonly referred to as "filtering") are able to produce macroparticle-free coatings without compromising other system aspects such as deposition rate, deposition area, ion transmission efficiency, and/or uniformity in coating. For example, many macroparticle filters of the prior art seek to separate the desired ions of cathode material through plasma optical techniques. Principally, these approaches always reside in leading the ions into an area where the workpieces may be arranged that is not in direct view of the cathode. Some of these techniques use deflecting tubes that eliminate direct line-of-sight paths between workpieces and the cathode. In these systems, macroparticles are captured on baffles arranged on the inside surface of the deflecting tubes and the workpieces are arranged at an open end of the deflecting tube and line-of-sight is prevented by a 45° to 90° bend in the tube. These systems are undesirable for many applications because only the ions that are emitted substantially along the axis of the tube are utilized, while ions traveling in other directions are lost. Additionally, the inside diameter of the deflecting tube must be small enough to prevent line-of-sight between the cathode and workpieces, so that the open cross-sectional area for ion passage through the filter is limited. Additionally, a significant portion of the ions that do make it into the curvilinear filter are subsequently lost to the walls during their relatively long passage through the tube, as a result of turbulence in the plasma. Consequentially, curvilinear type filters have an ion transmission efficiency of at best 25 percent. "Ionized Plasma Vapor Deposition and Filtered Arc Deposition; Processes, Properties and Applications" by P. J. Martin et al., *J. Vac. Sci. Technol.* A 17(4) July/August 1999. Additionally, the ions that do make it through curvilinear filters are distributed over a small and non-uniform area. For example, coating thickness variations can be as high as 15 to 100 percent over a deposition area of only 100 to 150 mm.

In addition, smaller macroparticles that are emitted substantially parallel to the deflecting tube can be reflected around the bend of the tube and through the filter to the workpieces. Electrostatic reflection from the walls of the deflecting tube has been shown to be a primary mechanism whereby macroparticles are transmitted through curvilinear-type filters. "Macroparticle Distribution in a Quarter-Torus Plasma Duct of a Filtered Vacuum Arc Deposition System," by M. Keidar et al., *J. Phys. D: Appl. Phys.* Vol. 30 (1997). Entrapment in the plasma stream and mechanical bouncing can also contribute to macroparticle transmission. Transmission of macroparticles through a filter by any of these mechanisms is more likely to occur when the geometry of the filter allows macroparticles to be emitted substantially parallel to the filter surfaces and/or in substantially the same direction as the plasma stream.

In an effort to reduce the transmission of macroparticles through the filter, two curvilinear filters connected together to form an S-shaped filter have been used to double the effect, but a further reduction in deposition rate has been noticed. For example, when this S-shaped-type filter is used, a 6 percent ion transport efficiency has been realized. Additionally, the larger size and complexity of this S-shaped filter limits its commercial application. To summarize, low ion transport efficiency, low deposition rate, small deposition area, macroparticle transmission and poor coating uniformity limit the commercial usefulness of curvilinear-type macroparticle filters.

Another approach to macroparticle filtration is described in U.S. Pat. No. 4,452,686 to Axenov et al. This approach utilizes ions emitted along the axis of a rotationally symmetrical container and leads these ions by reflection at the wall of the container around an obstacle which collects macroparticles, then into a substantially macroparticle-free area wherein the workpieces are arranged. The area which may be utilized for arranging workpieces is restricted to that part of the cross-sectional area of the container which is also the umbra of the obstacle for keeping off the droplets. Although this area will increase with decreasing diameter of the cathode, only a few workpieces may be coated simultaneously. Additionally, only the ions that are emitted along the axis are utilized while ions traveling in other directions are lost. This reduces the ion transport efficiency. Furthermore, similar to the curvilinear-type filters, macroparticles only have to be reflected through a small angle to reach the workpieces and are emitted in substantially the same direction as the plasma stream, so that transmission of macroparticles through reflection or entrainment in the plasma stream can still occur.

Furthermore, an approach to the elimination of macroparticles using another rotationally symmetrical device is shown in U.S. Pat. No. 5,282,944 to Sanders et al. This approach utilizes the ions emitted radially out from a ring-shaped cathode, and leads these ions by reflection through curved trajectories past baffles which collect macroparticles. In this approach, the area available for coating multiple workpieces is limited by the restricted opening through the baffles that is required to eliminate the typically line-of-sight path of the macroparticles between the cathode and the workpieces. Furthermore, macroparticles can be reflected through a small angle and can reach the workpieces and degrade the coating.

Yet another macroparticle filtering system is described in U.S. Pat. No. 4,929,321, granted to Buhl. This filtering approach directs ions emitted from an axially located cathode through a coaxial duct that blocks line-of-sight between the cathode and the workpieces, then radially transmits ions to the workpieces located at the outer periphery of the vacuum chamber. The axial portion of the vacuum chamber is not usable in this system and thus, much of the volume of the vacuum chamber is wasted. Additionally, this filtering approach cannot be separated from the design of the vacuum chamber, and thus, this filter is not easily adapted to preexisting vacuum chambers. Macroparticles reflected through small angles can also be a problem in this system.

Thus, in view of the foregoing problems with existing techniques for filtering macroparticles, there exists a need for an improved ion source that more effectively filters macroparticles out of the ion stream without compromising ion transport efficiency, deposition rate, deposition area, and coating uniformity. Additionally, there exists a need for an improved ion source that effectively filters macroparticles and substantially eliminates transmission of macroparticles by electrostatic reflection or entrapment in the plasma stream.

SUMMARY OF THE INVENTION

In view of the problems with existing macroparticle filtering techniques described above, the present invention relates to an apparatus and method for use in combination with an electric arc vapor deposition system (or any other ion source application where macroparticle filtering is desired) that substantially eliminates macroparticle transmission to the deposition area without substantially compromising deposition rate, deposition area, ion transport efficiency, or uniformity of the coating. In one embodiment, a filtered ion source useable with the present invention includes first and second ends connected by walls, said first end being closed and said second end being open to an area wherein workpieces may be treated; a consumable electrode source of material, said consumable electrode source including an evaporation surface positioned to face said first closed end and a first magnet for guiding ions along curved trajectories leading from the evaporation surface to the area wherein workpieces may be treated. In the embodiment just summarized, substantially macroparticle-free films are produced without substantially compromising deposition rate, deposition area, ion transport efficiency and uniformity because the evaporation surface of the consumable cathode material faces away from the deposition area and the ions are thereby required to bend around curved trajectories to reach the area wherein workpieces may be treated, while undesirable macroparticles, which are not strongly affected by magnetic or electrostatic forces, are substantially prevented from reaching the workpieces.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENTS

The embodiments described below relate to use of the present invention in a physical vapor deposition system using the cathodic arc. It is important to note that the present invention is by no means limited to deposition of materials on substrates but rather, the macroparticle filtering aspect of the present invention has several beneficial uses besides deposition. For example, efficient macroparticle filtering enables an arc ion source to function as a high intensity electron source for heating workpieces prior to coating. Additionally, this high electron density source is able to be used for excitation and ionization of vapor produced by an auxiliary evaporation source. When operating in such a mode, high intensity, low energy electron streams are capable of being produced. This heating capability may be exploited as a means for vacuum degassing components, surface annealing or other vacuum heat treatments. Thus, the present invention is by no means limited to use as a deposition system but rather any situation where efficient filtering of macroparticles from ions is beneficial can utilize the present invention.

Furthermore, the embodiments described below all relate to deposition systems using consumable cathode materials. One of ordinary skill in the art will appreciate that the present invention is not limited by the charge assigned to the source material.

Figure 1A:
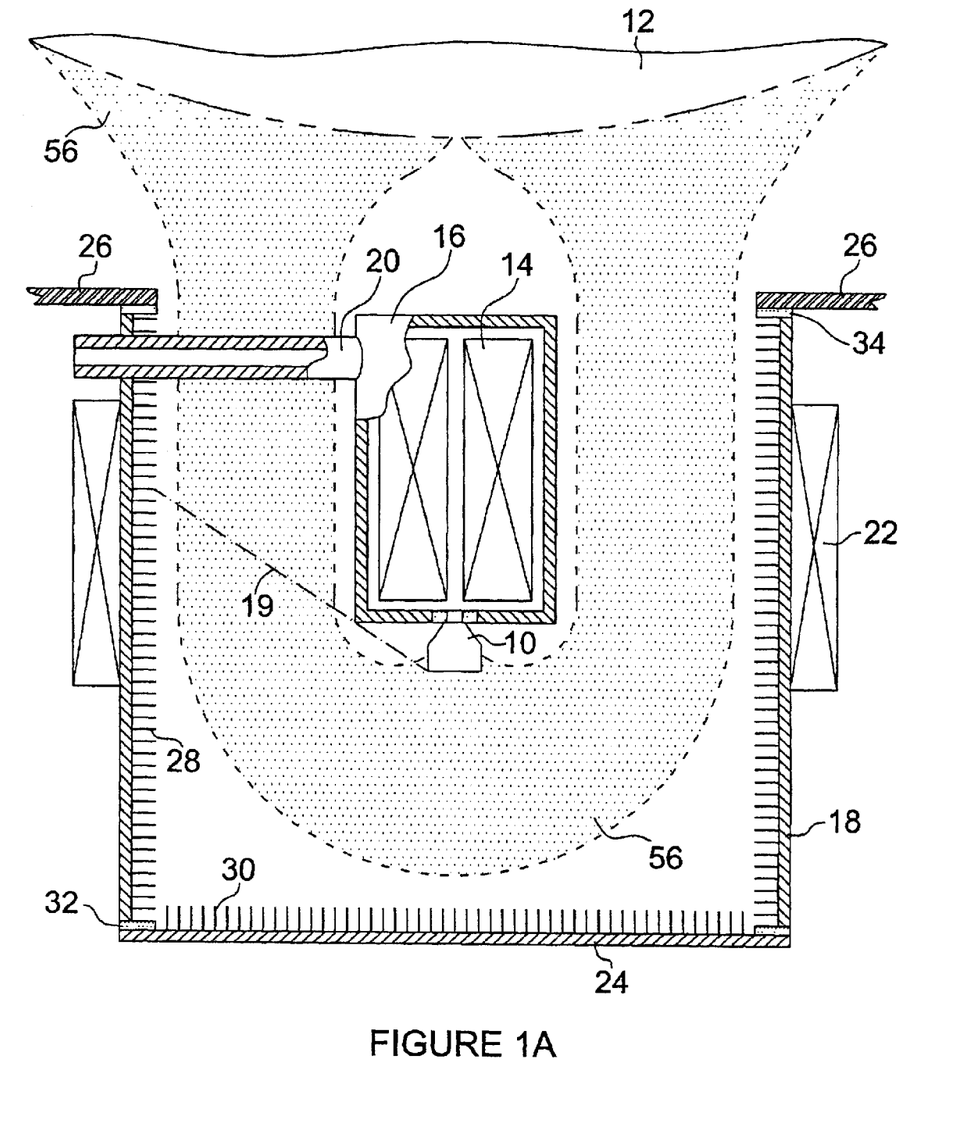
FIG. 1A is a schematic cross-sectional planar view of an ion source usable with the present invention.

With reference now to FIG. 1A, an embodiment of an ion source useable with the present invention will now be described. FIG. 1A is a schematic cross-sectional planar view of an apparatus for use in combination with an electric arc vapor deposition system where the vacuum chamber 26 and area 12 are illustrated schematically for purposes of simplicity. Cathodic arc vacuum chambers are well known in the art and thus the details and construction of the chamber itself will not herein be described. Workpieces are arranged in area 12 and may be mounted in a holder or fixture and rotated within area 12 to provide uniformity in coating and the availability of coating a large number of workpieces. Plasma duct 18 is capped at one end by endplate 24 and mounted to a vacuum chamber 26 which typically functions as the anode. Alternatively, the anode can be placed within area 12. Endplate 24, magnetic coil housing 16, duct 18, and pylon 20 are suitably made of a non-magnetic material such as stainless steel. The apparatus depicted in FIG. 1A uses a substantially cylindrical-shaped cathode 10 that has an evaporation surface facing away from the deposition area 12. In other words, the evaporation surface of cathode 10 faces the closed end of the ion source, which in this particular embodiment is endplate 24. During operation, the arc evaporates source material from the side of cathode 10 as well. Thus, an alternative arrangement of cathode 10 (not shown) may limit evaporation to a surface facing the wall of duct 18 as well. Inner magnetic coil 14 is located between cathode 10 and area 12. Inner magnetic coil 14 is contained within a housing 16 that also holds the cathode 10. The embodiment depicted in FIG. 1A contains an additional magnet 22 which is in opposition to inner magnet 14. As explained in greater detail below, magnets 14 and 22 are opposing electromagnets that are used to guide ions through the apparatus to the deposition area 12. Magnets 14 and 22 can also be permanent magnets. Housing 16, located between cathode 10 and deposition area 12, together with duct 18, act to prevent macroparticles from reaching deposition area 12.

Unlike electrons and ions, macroparticles traveling from the cathode 10 are not strongly affected by the magnetic or electrostatic fields present in the filter and cannot make the abrupt turn required to reach area 12. Instead, macroparticles collide with housing 16 or duct 18 and are thereby removed from the ion stream. Macroparticles are emitted in all directions from the arc spot on the cathode. Ion stream 56 represents the flow of ions during normal operation of the apparatus. Dotted line 19 represents the path of worst case macroparticles that come closest to reaching area 12. Dotted line 19 is thus a schematic demonstration of how macroparticles are effectively shielded by housing 16 and subsequently caught in baffles 28. Lengthening of duct 18 can reduce the likelihood of macroparticle transmission through the apparatus depicted in FIG. 1A because the proximity of the cathode source to the housing 16 prevents transmission of macroparticles into area 12. Thus, macroparticle trajectory 19 follows a substantially perpendicular path from the evaporation surface and follows a relatively straight line resulting in entrapment in baffles 28.

Baffles 28 are comprised of thin ribs or fins arranged substantially perpendicular to the expected macroparticle trajectories and are configured to catch macroparticles and/or prevent them from bouncing out of the filter. Endplate 24 may also be provided with end plate baffles 30 to catch macroparticles. A high temperature honeycomb material, such as that employed in aircraft engine composite structures (made of a nonmagnetic metal or other suitably dielectric material), may be used to form the baffle structures 28 and 30.

Cathode 10 may be made of an ion-forming, consumable material. Pure graphite supplied by POCO Graphite for providing carbon ions to deposit hard carbon or diamond-like carbon films is one example of a cathode material. Other suitably solid sources of carbon will be apparent to one skilled in the art and may include, for example, a pressed carbon powder or a fullerene-containing powder. Titanium, chromium, aluminum, vanadium, zirconium, tantalum, silicone, copper, stainless steel, and superconducting Nb are other examples of cathode materials. The cathode material can be of any suitable size. For example, the embodiment depicted in FIGS. 1A and 1B uses a substantially cylinder-shaped cathode with a diameter of about 3 cm. Moreover, the cathode 10 may be modified for increased life by increasing or adding a hollow center along the axis through housing 16 for purposes of holding an elongated cathode that may be extended by an automatic system at a rate equal to the consumption of the cathode. Additionally, the cathode 10 can be modified by mounting a fixture coming from the endplate 24 instead of mounting the cathode to the housing 16 as illustrated. Additionally, an elongated cathode may be extended by an automatic system at a rate equal to the consumption of the cathode through a hollow center along the axis through said endplate 24. The present invention is by no means limited to mounting of the cathode material 10 as depicted in FIG. 1A. For example, testing has revealed that cathode 10 can be positioned a predetermined distance away from housing 16 or alternatively, cathode 10 can be mounted from endplate 24 rather than on housing 16 as depicted.

Cathode 10, inner magnet coil 14, and housing 16 can be water cooled via lines or tubes (not shown) that extend through the hollow center of pylon 20 and are connected with an externally located coolant supply (not shown). Endplate 24 and duct 18 can also be water cooled. Cooling of the cathodes, anodes, housings, ducts, and magnet coils is well known in the art and is thus not described herein.

The relatively large currents of electrons inherent to cathodic arcs and the susceptibility of these electrons to manipulation by magnetic fields is exploited in the present invention. The magnetic field generated by inner magnet coil 14 and outer magnet coil 22 acts to constrain the flow of electrons from the cathode through the filter along the magnetic field lines 36, which creates an electrostatic field that guides the positive ions to the workpieces. Limiting crossfield motion of the electrons allows the electrostatic potential to build up in the system which in turn guides the ions. This electrostatic potential is augmented in the embodiment depicted by FIG. 1A by electrically isolating duct 18 from endplate 24 and vacuum chamber 26 with dielectric vacuum seals 32 and 34. Dielectric vacuum seals 32 and 34 are made of, for example, a fluoroelastomer rubber. Duct 18 and baffles 28, which are mounted on the inside surface of duct 18, then acquire a positive potential under energetic positive ion bombardment during arc operation, which augments the electric field that guides the ions through the filter. Electrically isolated endplate 24 and endplate baffles 30 can also acquire electrical potential during arc operation to assist in guiding ions through the filter. In experiments, positive potentials of as high as 45 volts between endplate 24 and the anode 26 have been measured during arc operation. Any crossfield conducting surfaces will reduce the electric field potentials produced, and reduced ion transport efficiencies through the filter. In the embodiment shown by FIGS. 1A and 1B, efficient ion transport is provided by incorporating a relatively large open annular area (approximately 458 cm$^2$, for example) between housing 16 and duct 18 for relatively unobstructed ion passage.

Figure 1B:
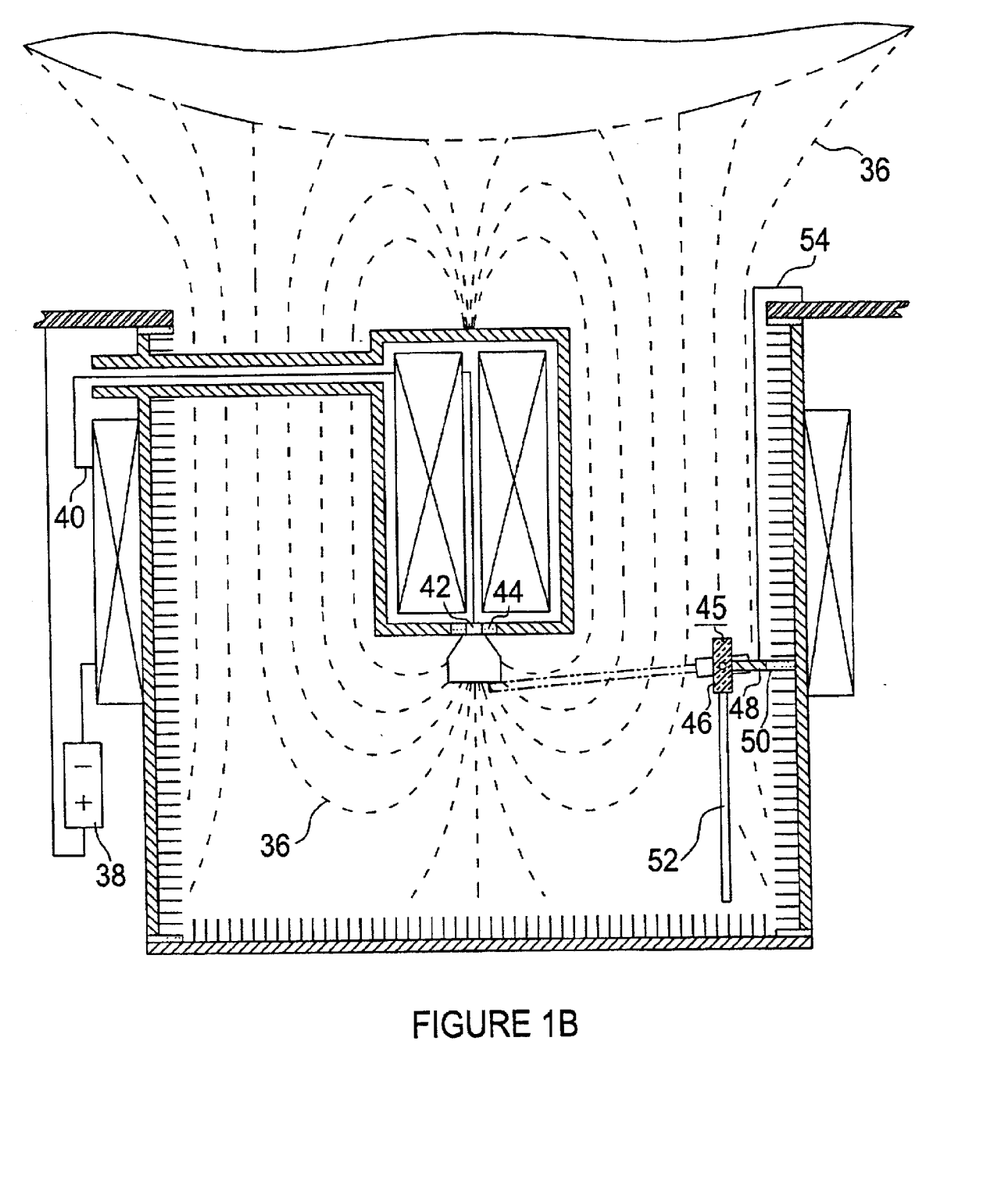
FIG. 1B illustrates schematically the magnetic field lines, triggering mechanism, and electrical circuitry of the embodiment depicted in FIG. 1A.

Efficient ion transport is also provided by the addition of outer magnetic coil 22, connected in opposition to inner magnetic coil 14. As shown in FIG. 1B, outer magnetic coil 22 acts in concert with inner magnet 14 to bend magnetic field lines 36 so that they pass through the open annular area between housing 16 and duct 18 and preferably do not intersect the wall of duct 18. It should be noted that although the ion source of FIGS. 1A and 1B uses two magnets, only one magnet may be needed to achieve the same or similar field and ion-guiding effect. Field lines intersecting the wall of duct 18 may provide a crossfield conducting surface and reduce the electrostatic potentials produced, resulting in a reduction in ion throughput. Outer magnetic coil 22 is preferably an annular ring around duct 18 but can take on any configuration that substantially produces the magnetic field depicted in FIG. 1B as lines 36.

Outer magnetic coil 22 also contributes to the overall strength of the magnetic field in the source providing for a relatively strong magnetic field from a compact apparatus. The individual fields produced by inner magnet coil 14 and outer magnet coil 22 combine constructively in the annular space between the coils. Magnetic strengths greater than 2,000 Gauss in this annular area, have been generated in the present invention. At these magnetic field strengths, it becomes likely that the Larmor radius of the typical ion is less than the open dimension through the filter (for example, less than 7.5 cm), with the result that the contribution to ion throughput from direct magnetic confinement of the ions becomes significant. One feature of the present invention is that it can provide for direct magnetic confinement of the ions as well as electrostatic confinement. Typically, prior art filters produce magnetic field strengths of less than 1,000 Gauss which is not strong enough to produce ion Larmor radii that are less than the inner diameter of these prior art filters. This results in ions colliding with the filter walls as they gyrate around the magnetic field lines, so that they are not transmitted.

As mentioned previously, in an alternate embodiment (not shown), only one magnet is used. For example, using only the inner magnet, ion throughput may decrease unless the duct diameter is increased or the whole apparatus is placed internal to a relatively large diameter vacuum chamber. The inventors has observed that the ion source was successfully operated using only the inner magnet.

The magnetic field 36 in the source also acts to confine the arc on cathode 10. Confining, directing and/or controlling the motion of the arc on the cathode using magnetic as well as other means such as electrical insulation, is well known in the art. The inventors has noticed that the cone shape of cathode 10 shown in FIGS. 1A and 1B helps to maintain the arc on the end and sides of cathode 10 and away from housing 16.

The magnetic field in the ion source also provides for arc stability by directing electrons from cathode 10 through the filter to the anode 26. As shown in FIG. 1B, chamber 26 is connected to the positive side of an arc power supply 38 as the anode. For maximum ion throughput, electrons from the cathode travel through the filter to reach the anode. This arrangement produces a good electrostatic field for guiding ions through the filter. Explained in greater detail below, experiments have shown that the arc stability is good in high vacuum even in the absence of a stabilizing gas such as argon. Thus, the arrangement depicted in FIGS. 1A and 1B produces a controlled arc and high ion throughput without a line-of-sight path between the evaporation surface of the cathode 10 and the anode 26.

In an alternative embodiment (not shown) the anode can be positioned close to the cathode. The end plate can be made the anode, for example. This may be desirable in certain cases including, for example, stabilizing the arc on cathode materials where the arc is normally difficult to maintain, such as refractory metals or semiconducts.

In FIG. 1B, cathode 10, and magnetic coils 14 and 22 are electrically connected in series with arc power supply 38 for the purpose of simplified operation using one power supply. In certain cases it may be desirable to separately control the current to one or both of the magnetic coils 14 and 22 and/or cathode 10 by using separate power supplies. This may be desirable in a situation where influence of the evaporation of the cathode 10 or influence of the coating of the workpieces is desired (e.g., to homogenize coatings). The present invention can be operated with magnetic coils 14 and 22 electrically connected in the circuit containing the arc, in series or in parallel, consecutively or separately, before the cathode and/or after the cathode. In the embodiment depicted in FIGS. 1A and 1B, arc power supply 38 has one lead connected to outer magnetic coil 22 and the other lead connected to chamber 26. Outer magnetic coil 22 is connected to inner magnetic coil 14 via an electrical lead 40. Inner magnetic coil 14 is connected to cathode 10 via a feedthrough 42 that is electrically insulated from the housing 16 by insulator 44. The feedthrough 42 may be made of a heat and electrically conductive material such as copper to provide electrical current as well as cooling to the cathode.

Experiments have shown that 31 turns of conductor in the outer magnetic coil 22 and 340 in the inner magnetic coil 14, with the coils in series with the arc, is a good ratio for constraining the magnetic field lines 36, thereby constraining electron flow and guiding ions through the ion source while at the same time providing for a uniform ion distribution over a relatively large area after the ions have been exited. This number of turns suitably generates a magnetic field strength of approximately 2,000 Gauss in the annular area between housing 16 and duct 18 at a current of 100 amperes. The distribution of ions that have exited the filter can be varied from a uniform, diffuse pattern, to a focused beam centered along the axis of the source by increasing the number of turns of conductor (or the amount of current) in the outer magnetic coil relative to the inner magnetic coil. The number of turns in the inner and outer magnetic coil and the strength of the magnetic field produced by said magnetic coils is provided for illustrative purposes only and the invention is not limited to this number of turns or field strength. As previously mentioned, all or part of the magnetic field of the invention could be created with permanent magnets instead of magnetic coils. Thus, the present invention is not limited to the use of electromagnets, and one of ordinary skill in the art could employ comparable permanent magnets to produce the specific magnetic field lines 36. It should also be noted that the cylindrical symmetry does not necessarily need to be maintained. For example, it may be desirable to use a larger elongated cathode and magnets for the purpose of providing an elongated coating area to suit efficient large scale industrial coating applications as described in greater detail with reference to FIGS. 2A, 2B and 2C.

With continuing reference to FIG. 1B, there is also shown an embodiment in which the arc trigger is initiated mechanically by an automatic trigger system 45. Trigger system 45 is influenced by magnetic field 36. The magnetic field 36 generated when the circuit that includes the arc and magnetic coils 14 and 22 is energized, causes a trigger assembly 45 including contactor 52 to rotate away from the cathode, thereby initiating the arc. The trigger assembly 45 is weighted to return quickly to cathode 10 when the arc (and the magnetic field created by magnetic coils 14 and 22) extinguishes, thereby automatically and immediately retriggering the arc. This trigger assembly 45 responds quickly when the arc extinguishes and allows arc operation to be pulsed at low currents, for example, 10 amperes, where operation is typically impractical because the arc does not sustain itself and almost immediately extinguishes. Although both magnetic coils 14 and 22 are in the arc circuit as shown in FIG. 1B, either magnetic coil can be used alone in the circuit with the arc, to operate the automatic trigger 45. It is to be appreciated that the arc between the anode and the cathode can be initiated by any conventional means that are well known in the art, other than that specified.

With further reference to FIG. 1B, the operation of trigger assembly 45 will be described in greater detail. The trigger assembly 45 comprises a support arm 48, attached via an electrical insulator 50 to duct 18. Trigger assembly 45 can alternatively be attached to the wall of duct 18 by any other support structure well known in the art. Additionally, trigger assembly 45 comprises a permanent magnet 46 that can be constructed, for example, of AlNiCo and a contactor 52. The trigger assembly 45 is supplied with power from conductor lead 54 which is, for example, an insulated wire. Contactor 52 is made of an electrically conductive material that also will not contribute contamination to the coatings from being arc evaporated during triggering, for example, graphite when a graphite cathode is used, or a high temperature material such as tungsten for contacting metal cathodes such as titanium. Trigger magnet 46 and contactor 52 are weighted to rotate around a hinge point or biased by springs such that contactor 52 will rest against cathode 10 when the arc circuit is not energized as shown in FIG. 1B in phantom outline. When the arc circuit is not energized and the trigger assembly rests against the cathode, the electrical circuit between cathode 10 and the anode chamber 26 is closed. When arc power supply 38 is energized, current passes through magnetic coils 14 and 22 before returning to the anode via trigger assembly 45. Permanent magnet 46 rotates in order to align itself with the magnetic field created by energized magnetic coils 14 and 22, thereby retracting the trigger away from the cathode 10 to the position shown by FIG. 1B which initiates the arc. When the arc extinguishes, the electrical circuit is opened, current to magnetic coils 14 and 22 is thereby stopped and the magnetic field which effects permanent magnet 48 disappears. Furthermore, the trigger assembly extends to contact cathode 10, thereby closing the circuit, which reinitiates the cycle to trigger the arc.

Figure 2A:
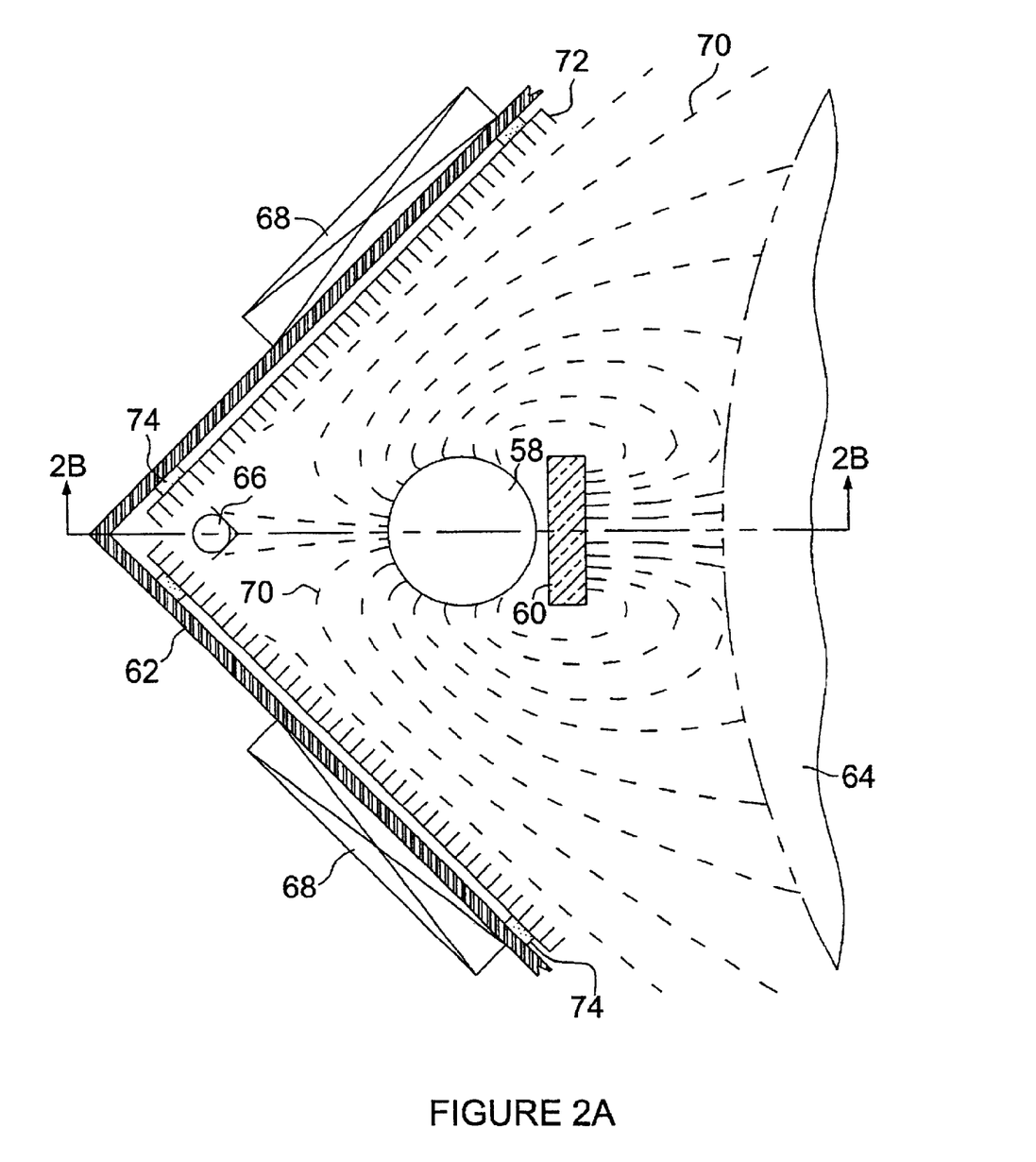
FIG. 2A is a schematic top cross-sectional view of an alternate embodiment of an ion source useable with the present invention.
Figure 2B:
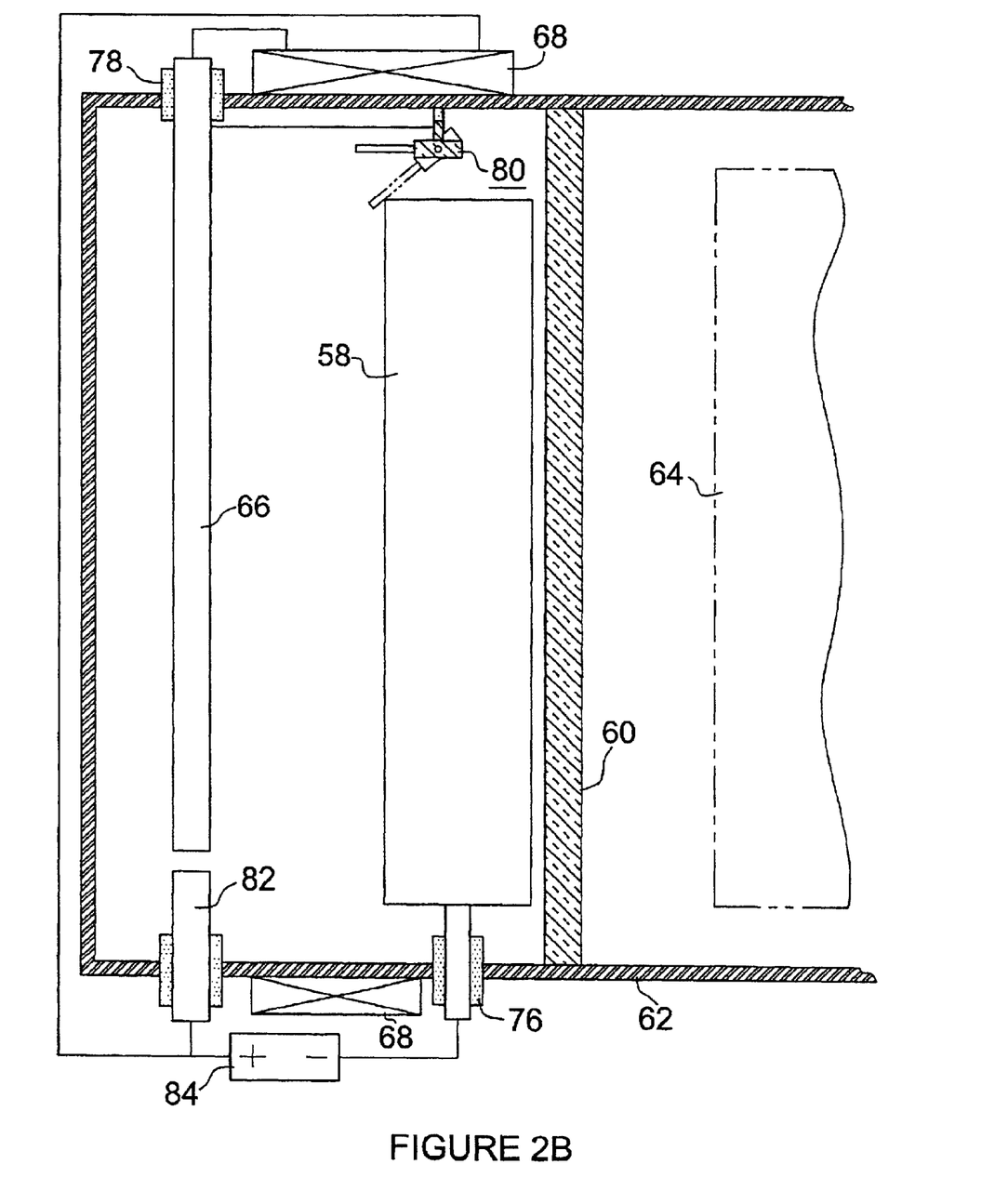
FIG. 2B is a schematic cross-sectional side view of the embodiment depicted by FIG. 2A.

With reference now to FIGS. 2A and 2B, the embodiment depicted in these drawings will be described in greater detail. FIG. 2A is a partial top planar cross-sectional view of an alternate embodiment useable with the present invention. The ion source of FIG. 2A uses a relatively large cylindrical cathode 58 and a permanent magnet 60 which are located in the corner of a rectangular vacuum chamber 62. In this particular embodiment, the corner of vacuum chamber 62 represents a closed end of the ion source and the deposition area 64 represents an open area of the ion source. The evaporation surface of cathode 58 is along the length of the cathode 58 that faces the corner of chamber 62 and away from deposition area 64 wherein workpieces may be located for coating. Only one corner of vacuum chamber 62 is shown for simplicity. One of ordinary skill in the art would recognize that other corners or ends may also contain ion sources such as the one depicted in FIG. 2A. The walls of vacuum chamber 62 may be the anode or preferably as shown, a discrete anode 66 may be used. The shape of anode 66 is tailored to provide a surface which reflects incident macroparticles away from deposition area 64 such as the wedge shape that is shown. Vacuum chamber 62 and anode 66 are preferably made of a nonmagnetic material such as stainless steel.

A magnetic coil 68 is arranged substantially around the corner on the outside of vacuum chamber 62 and generates a magnetic field that is directed in opposition to the field produced by permanent magnet 60. It should be noted that permanent magnet 60 may easily be replaced with an electromagnet as used in the embodiment already described in that the substitution of permanent magnets with electromagnets and vice versa is well known in the art.

In operation, the arc runs along the entire length of cathode 58, always along the side facing anode 66. The magnetic field generated by permanent magnet 60 and magnetic coil 68 contains the arc on the anode side of the cathode 58 and directs a portion of electrons to anode 66 for arc stability and furthermore directs the remaining portion of the electrons through the area between permanent magnet 60 and magnetic coil 68 thereby producing an electrostatic field for guiding positive ions to deposition area 64. Ions are extracted from the cathode region radially out along both sides of the cathode 58 to where there is a large open area for ion passage between permanent magnet 60 and magnetic coil 68 then bent back through curved trajectories substantially reversing their initial direction and directed to deposition area 64 in a spread out uniform pattern. Large currents of ions are thus guided through a substantially 90° to 180° path while macroparticles traveling from the cathode must be reflected through prohibitively abrupt angles to reach deposition area 64 and are instead caught in baffles 72 mounted on the walls of vacuum chamber 62.

Permanent magnet 60, for example, can be made of a rare earth neodymium-iron-boron material and measuring approximately 5.1 cm by 1.3 cm in cross-section. The outer magnet 68 may be constructed with approximately 100 turns of conductor and designed to carry approximately 100 amperes of current to produce magnetic field lines 70 as depicted in FIG. 2A. The dimensions and material of the permanent magnet 60 and the number of turns in the magnetic coil 68 and current are provided for illustrative purposes only and the invention is by no means limited to these dimensions, materials, number of turns, or current.

With reference now to FIG. 2B, a schematic side planar cross-sectional view of the ion source is depicted. As shown, trigger assembly 80 functions in a similar way to the trigger assembly previously described. That is, the magnetic field 70 generated when the circuit that includes the arc and magnetic coil 68 is energized, causes a trigger assembly 80 to rotate away from the cathode, thereby initiating the arc. The trigger assembly is weighted to return quickly to the cathode 10 when the arc and magnetic field 70 extinguishes, thereby automatically and immediately retriggering the arc. As stated previously, however, the arc between the anode and cathode can be initiated by any conventional means that are well known the art other than that specified.

With further reference to FIGS. 2A and 2B, the magnetic field produced by permanent 60 and magnetic coil 68 will be described in greater detail. The magnetic field 70 acts to confine the arc on the side of the cylindrical cathode 58 that faces directly toward anode 66 and directly away from area 64 in at least four different ways. First, as well known the art, the arc tends to move from an obtuse to an acute angle between field lines 70 and the surface of cathode 58, and thereby migrates to the point on cathode 58 where the field lines are perpendicular to the cathode surface, which is the point that directly faces anode 66. Second, magnetic field lines 70 travel directly to anode 66 from this same point on cathode 58, which contributes to confining the arc here, as well as providing for arc stability. Third, the arc will prefer the point on cathode 58 that is closest to anode 66, and fourth, magnetic coil 68 is connected in the electrical circuit with the arc, after anode 66 (as best seen in FIG. 2B) so that the arc will be retriggered if insufficient current passes through anode 66 and to magnetic coil 68, which would be the case if the arc travels away from the side of cathode 58 that faces anode 66.

Line-of-sight between cathode 58 and deposition area 64 is blocked by the body of the cathode 58 itself, thereby preventing contamination of deposition area 64 by macroparticles. As was previously described with reference to the embodiment depicted in FIGS. 1A and 1B, the macroparticles are not strongly affected by the magnetic and electrostatic forces and thus travel at relatively straight trajectories. Therefore, macroparticles generated from the evaporation surface of cylindrical cathode 58 will be caught in baffles 72 and shielded from deposition area 64 by the cathode itself. It should be noted that simply moving deposition area 64 to a greater distance from the cathode will help to eliminate any macroparticle transmission by reflection.

As explained previously, it is desirable that the inner surface of vacuum chamber 62 be provided with baffles 72 as best depicted in FIG. 2A. The baffles 72 are in the form of thin ribs or fins arranged substantially perpendicular to the expected macroparticle trajectories, to catch macroparticles and/or prevent them from bouncing from the walls of vacuum chamber 62 into deposition area 64. Baffles 72 are formed into panels that are electrically isolated from the walls of the vacuum chamber 62 by dielectric spacer 74. Baffle panels 72 then quickly acquire a positive potential under energetic ion bombardment during arc operation, which augments the electric field that guides the positive ions into area 64. A high temperature honeycomb material, for example, can be used for baffles 72. An additional benefit is that baffle panels 72 can be easily removed from vacuum chamber 62 for replacement or cleaning. The walls of the prior art vacuum chambers may build up with coating material that must be periodically removed. This typically is a laborious process that takes away from production time.

With further reference to FIG. 2B, cathode 58 can be mounted in an electrically isolated rotary cathode feedthrough 76 that extends into vacuum chamber 62 from the bottom. Anode 66 extends through the top of vacuum chamber 62 through an electrically isolated anode feedthrough 78.

An automatic trigger assembly 80, the operation of which has already been described, can be used to trigger the arc at the end of cathode 58, opposite cathode feedthrough 76 (i.e. at the "top" of cathode 58). Current traveling from anode 66 through magnetic coil 68 holds trigger assembly 80 away from cathode 58 while the arc is operating, until the arc reaches the bottom of cathode 58. As is well known in the art, the arc will travel toward the end of the cathode that is connected to the negative side of the power supply. Accordingly, the arc travels along (i.e. "down") cathode 58, on the side of cathode 58 that faces the anode 66. When the arc reaches the bottom of cathode 58, current passes through secondary anode 82 instead of anode 66, and directly to arc power supply 84, effectively bypassing magnetic coil 68. Magnetic coil 68 is then not energized, which causes trigger assembly 80 to retrigger the arc at the end of cathode 58 opposite cathode feedthrough 76, which reinitiates the cycle. The arc runs continuously in the same direction from one end of cathode 58 to the other, along the side facing directly towards anode 66 and directly away from area 64. The arc can be triggered and extinguished by any other means that are well known in the art, other than that specified.

Efficient use of cathode 58 is provided by rotating the cathode around its axis. It is preferred to rotate cathode 58 constantly during arc operation, although period rotation may also be used. The arc remains on the side of the cathode facing anode 66 while cathode 58 rotates beneath the arc, eroding spiral paths along the surface of the cathode 58 and thereby over time, efficiently consuming the entire outer surface of cathode 58. The cathode 58 may be constructed of different materials whereby rotating the cathode to align the desired evaporation material beneath the arc track allows the formation of multilayer structures or coatings on the workpieces. A cathode 58 that has one or more flat evaporation surfaces instead of a cylindrical shape may also be used.

Cathode 58 is preferably in the form of a hollow tube for the purpose of providing internal water cooling via lines or tubes that extend into the hollow center of cathode 58 and are connected with an externally located coolant supply (not shown). The outside diameter of cathode 58 may be 5.1 cm and the inside diameter may be 1.3 cm for example. Anode 66 is also preferably hollow and can be similarly water cooled. Permanent magnet 60 may also be water cooled. It is preferable that magnet coil 68 be made of a hollow conductor wire, copper tubing, for example, for the purpose of water cooling of the magnet coil 68. An additional benefit of using a water cooled hollow conductor in magnet coil 68 is that the walls of vacuum chamber 62 are also cooled, which eliminates or reduces the need for a separate cooling system for vacuum chamber 62, which is otherwise typically required to remove the heat produced and transferred to the walls of the vacuum chamber 62 as a byproduct of the coating process.

Figure 2C:
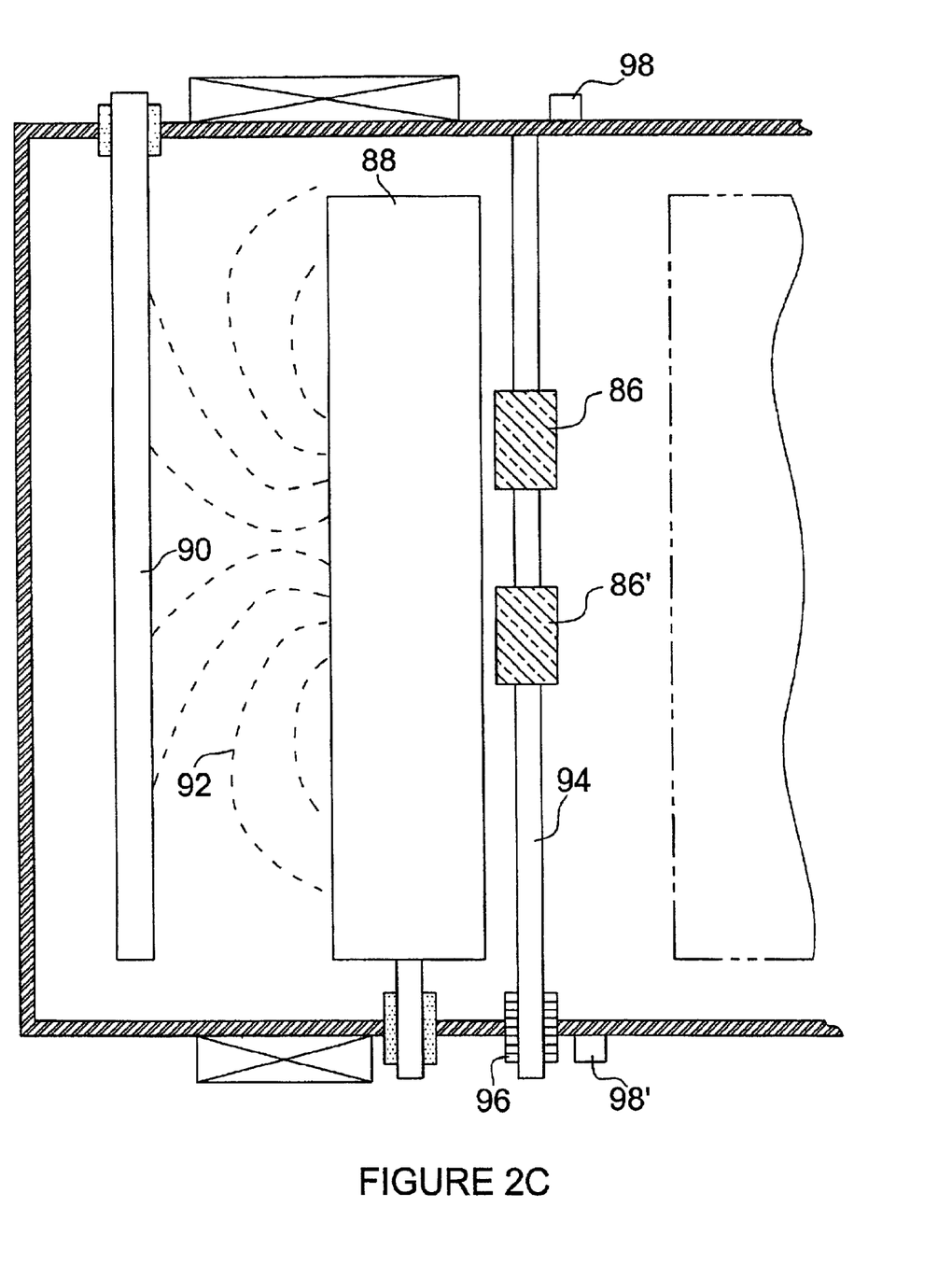
FIG. 2C schematically illustrates another embodiment of an ion source useable with the present invention in a side cross-sectional planar view.

With reference now to FIG. 2C, an additional embodiment utilizing two permanent magnets 86 and 86' will now be described. Permanent magnets 86 and 86' are arranged with a space between them such that their combined magnet field acts to confine the arc between them at the point on cathode 88 facing anode 90. It is well known in the art that electric arcs tend to move from an obtuse to an acute angle between the magnetic field lines and the cathode surface, whereby converging magnetic field lines 92 act to confine the arc at the point between permanent magnets 86 and 86' on the side of the cathode that faces anode 90. Permanent magnets 86 and 86' can be mounted to a linear motion system using a rotatable threaded shaft 94, that allows magnets 86 and 86' to be moved up and down the length of cathode 88. The arc is thus controllably directed to anywhere along the entire length of cathode 88 according to the movements of permanent magnets 86 and 86'. The motion of the arc along the length of the cathode 88 can also be directed by other means that are well known in the art such as using phase variable magnet coils.

Threaded shaft 94 can be rotated via means such as a motor (not shown) that is connected to shaft 94 via feedthrough 96. The direction of the motor's rotation may be controlled by sensors 98 and 98'. Sensors 98 and 98' may be of any sensor motor circuitry technology that is available in the art. In another embodiment, shaft 94 may be rotatably coupled to the cathode rotation, thereby eliminating one motor and simplifying the overall apparatus.

The arc is preferably triggered automatically by a trigger mechanism that has been described previously. The trigger can be attached to the linear motion systems such that it is always triggered at the point on cathode 88 where the arc is confined by magnets 86 and 86'. The trigger can be electrically isolated from the liner motion system by simple and well known dielectric means, and electrically connected to anode 90 by a simple flexible wire. The arc between the anode and the cathode can also be initiated by any conventional means that are well known in the art.

The arrangement for confining and directing arc motion by means of linearly translatable permanent magnets as depicted in FIG. 2C provides control over arc location on the cathode to manipulate deposition uniformity and cathode erosion. In addition, this embodiment permits use of fewer, expensive rare earth magnets and provides good multi-layer coatings or structures. To deposit multi-layer coatings or structures, the cathode may be constructed of tubular sections made of different materials that are stacked on top of each other, whereby the arc can be directed to different evaporation materials.

With continuing reference to FIG. 2C, the motion scheme for the arc will now be described in greater detail. After the arc is triggered, threaded shaft 94 is rotated in one direction to move magnets 86 and 86' up until the arc reaches the top of cathode 88. At this point, shaft 94 is caused to rotate in the other direction by means such as a sensor 98, which senses the proximity of magnet 82. The arc is then caused to travel down the length and to the bottom end of cathode 88 where sensor 98' causes shaft 94 to reverse direction, moving the arc up cathode 88 again, reinitiating the arc movement cycle. The arc is thus caused to run up and down the entire length of cathode 88, always long the side facing anode 90, while cathode 88 rotates thereby providing for uniform cathode erosion and uniform coating coverage over an extended area. Alternatively, the arc motion system may be programmed using well known computer means to maintain the arc on a reduced length section of the cathode to provide coating coverage of a smaller area. This would provide for substantially non-wasteful cathode use when the number of workpieces to be coated is relatively small. In yet another alternative arc motion scheme, the arc motion system may be programmed using well known computer means to move at particular times to different sections of the cathode, which may be made of different materials as described above to control the formation of multi-layer coatings or structures.

EXAMPLE 1

In experiments to determine carbon ion transport efficiency, a 61 cm diameter substrate was positioned approximately 28 cm from the exit of the ion source depicted schematically in FIGS. 1A and 1B and biased at 100 volts to collect the carbon ion flux exiting the filter. A carbon cathode was used and was operated at 84 amperes cathode current, at high vacuum to produce the carbon ions.

Figure 3A:
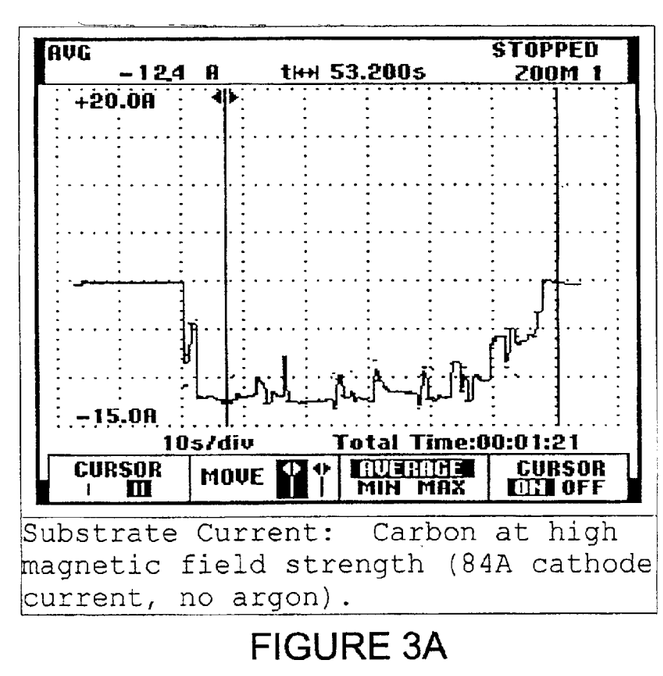
FIG. 3A is a plot of carbon ion current collected on a large substrate.

As can be seen in the graph depicted by FIG. 3A, the carbon ion current spent the majority of the time at approximately 12 amperes, peaked for short periods at about 13 amperes, and dipped for short periods to about 9 amperes. An average of the carbon ion current taken over 48 seconds was 11.6 amperes.

Ion flux from an unfiltered cathodic arc ion source such as those available from the prior art typically amounts to 10 percent of the cathode current. Ion flux from a curvilinear filter operating at 25 percent efficiency would be 2.5 percent of the cathode current. The average carbon ion current obtained from the data depicted in FIG. 3A, 11.6 amperes is 13.8 percent of the 84 amperes cathode current. These results indicate that carbon ions were transported through the filtered ion source invention at a very high efficiency.

EXAMPLE 2

In experiments to determine titanium ion transport efficiency, a 61 cm diameter substrate was positioned approximately 28 cm away from the exit of the ion source schematically depicted in FIGS. 1A and 1B and biased at 100 volts to collect the titanium ion flux exiting the filter. A titanium cathode was used and operated at 84 amperes cathode current, with 1 mTorr argon present, to produce the titanium ions.

Figure 3B:
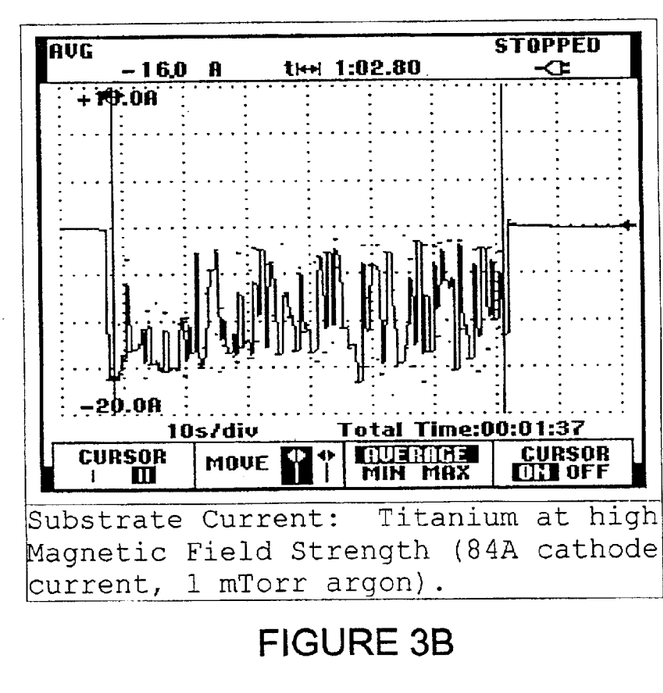
FIG. 3B is a plot of titanium ion current collected on a large substrate.

As can be seen in the data summarized in FIG. 3B, the titanium ion current fluctuated between a maximum of about 16 amperes and a minimum of about 2 amperes. An average of the titanium ion current taken over 63 seconds was 9.8 amperes, which is 11.7 percent of the 84 ampere cathode current. These results indicate that titanium ions were transported through the filtered ion source at a very high efficiency.

EXAMPLE 3

In experiments to determine carbon and titanium ion throughput at different magnetic field strengths, a 61 cm diameter substrate was positioned approximately 28 cm away from the exit of the ion source and biased at 100 volts to collect the carbon or titanium ion flux exiting the filter, while magnetic field strength was varied. A titanium cathode was used in the embodiment of the ion source depicted in FIGS. 1A and 1B and operated at 84 amperes cathode current, with 1 mTorr argon to produce the titanium ions. A carbon cathode was also used and operated at 84 amperes cathode current at high vacuum to produce the carbon ions. Ion current was recorded for approximately 1 minute, at different magnetic field strengths and the data averaged to obtain the data points graphed in FIG. 3C.

Figure 3C:
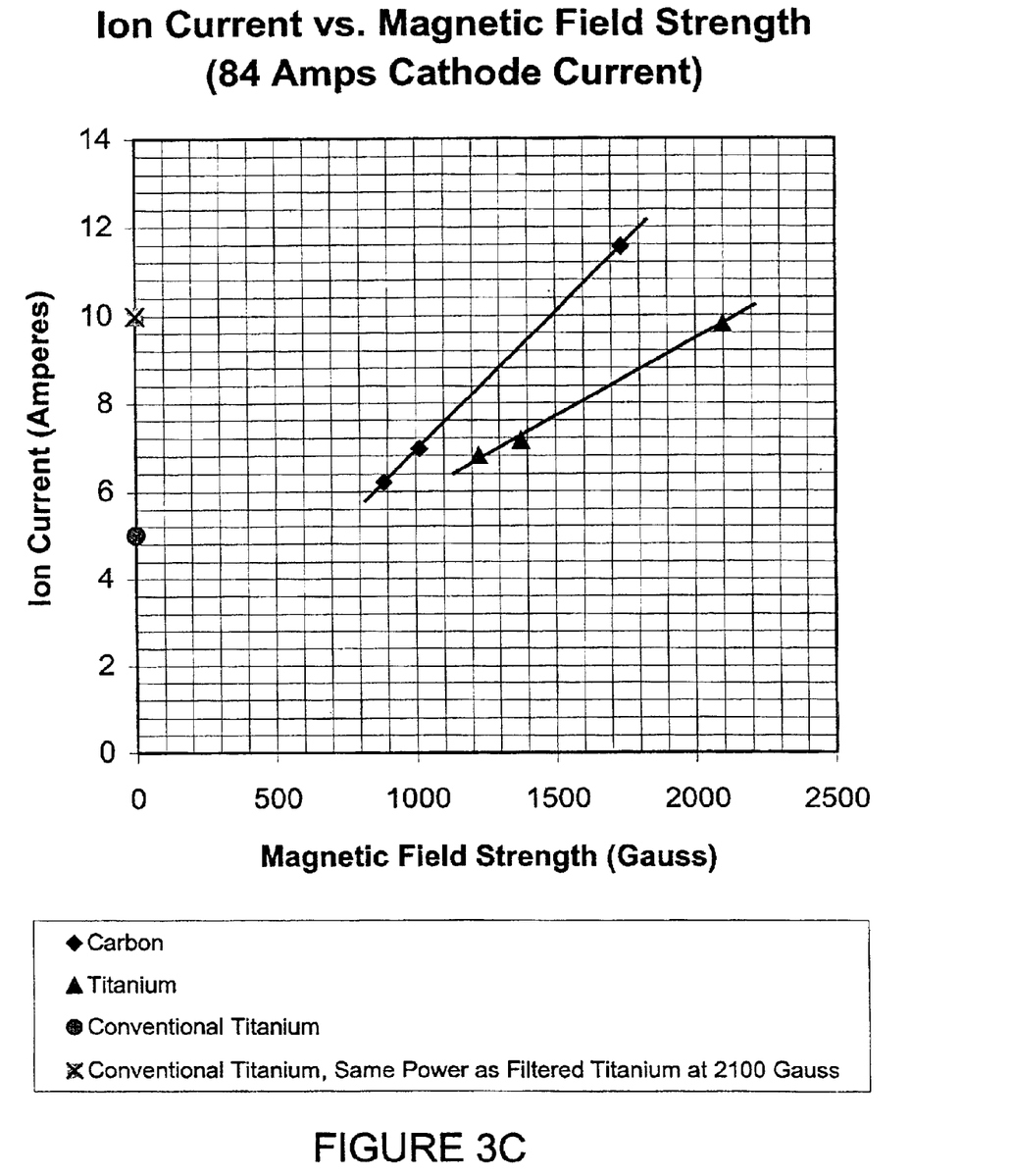
FIG. 3C is a graph showing the carbon and titanium ion current collected on a large substrate at different magnetic field strengths, and the titanium ion current produced by a conventional unfiltered cathodic arc ion source and collected on the same large substrate.

As can be seen in FIG. 3C, ion current for both carbon and titanium ions increased with magnetic field strength. A line was fit to both sets of data quite closely, suggesting that ion current increases linearly with magnetic field strength.

For direct comparison, a conventional unfiltered cathodic arc titanium ion source, as is well known in the art, was operated at the same 84 amperes cathode current, with the same 1 mTorr argon, using the same large substrate at the same bias, positioned at the same distance (28 cm away from the cathode). At these conditions, as shown by the data in FIG. 3C, the conventional titanium source produced only 5 amperes titanium ion current. When operated at the same power (obtained by increasing the cathode current) as the present invention operating with titanium at high magnetic field strength (84 amperes at 51 volts), the conventional titanium source then produced 10 amperes titanium ion current. The present invention produced about the same titanium ion flux (9.8 amperes) on a large substrate, as a conventional, unfiltered, cathodic arc titanium ion source (10 amperes) operating at the same power. These results indicate that titanium ions were transported through the filtered ion source in accordance with the present invention at a very high efficiency, approaching 100 percent.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A filtered ion source comprising:
   (i) first and second ends connected by walls, said first end being closed and said second end being open to an area wherein workpieces may be treated;
   (ii) a consumable electrode source material, said consumable electrode source material including an evaporation surface positioned to face said first closed end; and
   (iii) a first magnet for guiding ions along curved trajectories, said first magnet being positioned between said consumable electrode source material and said area wherein workpieces may be treated, and wherein said curved trajectories lead from said evaporation surface to said area wherein workpieces may be treated.

2. The ion source of claim 1, wherein said consumable electrode source includes an evaporation surface positioned to face said walls.

3. The ion source of claim 1, wherein said first magnet further comprises a shielding surface that is substantially parallel to said closed end, and wherein said shielding surface is of a sufficient area to shield macroparticles released from said evaporation surface.

4. The ion source of claim 1, wherein said consumable electrode source material includes a shielding surface that is substantially parallel to said closed end, and wherein said shielding surface is of a sufficient area to shield macroparticles released from said evaporation surface.

5. The ion source of claim 1, wherein said curved trajectories comprise at least 90°.

6. The ion source of claim 1, further comprising a second magnet in opposition to said first magnet and positioned for guiding ions along said curved trajectories.

7. The ion source of claim 1, wherein said walls include baffles.

8. The ion source of claim 7, wherein said baffles are constructed of a honeycomb material.

9. The ion source of claim 6, wherein at least one of said magnets comprises a magnetic coil.

10. The ion source of claim 1 further comprising water cooling means.

11. The ion source of claim 1, wherein said consumable electrode source material is rotatable.

12. The ion source of claim 1, wherein said consumable electrode source material is extendable.

13. The ion source of claim 1, wherein said consumable electrode source material is constructed of a plurality of sections, each composed of a different material.

14. The ion source of claim 1, wherein said first end is electrically isolated from said walls.

15. The ion source of claim 1, wherein said first and second ends connected by walls comprise substantially a cylinder configuration.

16. The ion source of claim 1, wherein said first and second ends connected by walls comprises a corner of a vacuum chamber.

17. A filtered ion source comprising:
   (i) first and second ends connected by walls, said first end being closed and said second end being open to an area wherein workpieces may be treated;
   (ii) a consumable electrode source material, said consumable electrode source material including an evaporation surface positioned to face said walls; and
   (iii) a first magnet for guiding ions along curved trajectories said first magnet being positioned between said consumable electrode source material and said area wherein workpieces may be treated and wherein said first magnet is further positioned and adapted to shield said area wherein workpieces may be treated and wherein said curved trajectories lead from said evaporation surface to said area wherein workpieces may be treated.

18. A filtered ion source comprising:
   (i) first and second ends connected by walls, said first end being closed and said second end being opened to an area wherein workpieces may be treated;
   (ii) a consumable electrode source material, said consumable electrode source material being positioned between said first and second ends and including an evaporation surface positioned to face said first closed end and said walls;
   (iii) a first magnet for guiding ions along curved trajectories said first magnet being positioned between said consumable electrode source material and said area wherein workpieces may be treated and wherein said curved trajectories lead from said evaporation surface to said area wherein workpieces may be treated; and
   (iv) a counter electrode positioned proximate to said second end.

19. The ion source of claim 18, wherein said counter electrode is positioned within said area wherein workpieces may be treated.

20. A trigger for initiating an electric arc comprising:
   (i) a permanent magnet hingedly connected to a support structure; and
   (ii) an electrical contactor affixed to said permanent magnet said contactor being capable of supplying electricity to a consumable electrode source material.

21. The trigger of claim 20, wherein said permanent magnet is weighted to rest said electrical contactor on said consumable electrode source material.

22. The trigger of claim 20, wherein said permanent magnet is biased by a spring such that said electrical contactor rests on said consumable electrode source material.

23. A method for transmitting ions from a consumable electrode source material comprising the steps of:
   (i) providing a consumable electrode source material in electrical relationship with an arc source such that an evaporation surface of said source material faces a closed end of an ion source;
   (ii) arranging workpieces in an area for treatment, said area for treatment being located at least 90° in rotation from said evaporation surface;
   (iii) applying an electric arc to said consumable electrode source material; and
   (iv) guiding ions along curved trajectories leading from said evaporation surface to said area for treatment.

24. The method of claim 23, wherein said electric arc is pulsed.

25. The method of claim 23, further comprising the step of providing a counter electrode positioned within said area for treatment.

26. A filtered cathodic ion source, said ion source comprising a filter, said filter having an exit and said ion source further comprising at least one anode, wherein said anode is positioned past the exit of said filter and wherein said filter is further adapted such that all of the anodic current passes through said exit.

* * * * *

UNITED STATES PATENT AND TRADEMARK OFFICE
CERTIFICATE OF CORRECTION

PATENT NO. : 6,756,596 B2 Page 1 of 1
DATED : June 29, 2004
INVENTOR(S) : P.E. Sathrum It is certified that error appears in the above-identified patent and that said Letters Patent is hereby corrected as shown below:

Title page,
Item [*] Notice, "bydays.days." should read -- by 2 days. --
Item [56], References Cited, OTHER PUBLICATIONS, "Martin, P.J., and Bendavid." reference, "Applications." *Journal*" should read -- Applications," *Journal* --
"Sanders D.M.," reference, "Sanders. D.M.," should read -- Sanders, D.M., --

Signed and Sealed this

Seventh Day of December, 2004

JON W. DUDAS
*Director of the United States Patent and Trademark Office*